United States Patent
Huang et al.

(10) Patent No.: US 9,484,208 B2
(45) Date of Patent: Nov. 1, 2016

(54) PREPARATION METHOD OF A GERMANIUM-BASED SCHOTTKY JUNCTION

(71) Applicant: Peking University, Beijing (CN)

(72) Inventors: Ru Huang, Beijing (CN); Meng Lin, Beijing (CN); Zhiqiang Li, Beijing (CN); Xia An, Beijing (CN); Ming Li, Beijing (CN); Quanxin Yun, Beijing (CN); Min Li, Beijing (CN); Pengqiang Liu, Beijing (CN); Xing Zhang, Beijing (CN)

(73) Assignee: Peking University, Beijing (CN)

(*) Notice: Subject to any disclaimer, the term of this patent is extended or adjusted under 35 U.S.C. 154(b) by 135 days.

(21) Appl. No.: 14/380,026

(22) PCT Filed: Sep. 30, 2013

(86) PCT No.: PCT/CN2013/084721
§ 371 (c)(1),
(2) Date: Aug. 20, 2014

(87) PCT Pub. No.: WO2014/146418
PCT Pub. Date: Sep. 25, 2014

(65) Prior Publication Data
US 2016/0133475 A1    May 12, 2016

(30) Foreign Application Priority Data
Mar. 18, 2013   (CN) .......................... 2013 1 0084986

(51) Int. Cl.
*H01L 21/28* (2006.01)
*H01L 21/285* (2006.01)
(Continued)

(52) U.S. Cl.
CPC ..... *H01L 21/28537* (2013.01); *H01L 21/0228* (2013.01); *H01L 21/02192* (2013.01);
(Continued)

(58) Field of Classification Search
CPC .................. H01L 21/0228; H01L 21/02568; H01L 21/3213; H01L 21/28537; H01L 21/02192; H01L 21/02266; H01L 21/02271
USPC ........................................................ 348/572
See application file for complete search history.

(56) References Cited

U.S. PATENT DOCUMENTS 6,480,412 B1* 11/2002 Bessho ................. B82Y 10/00
257/E21.665
2008/0248618 A1* 10/2008 Ahn ........................ C23C 16/40
438/240
(Continued)

FOREIGN PATENT DOCUMENTS

CN    101629033    1/2010
CN    102222687 A   6/2011
(Continued)

OTHER PUBLICATIONS

Yi Zhou, "Alleviation of Fermi-level pinning effect on metal/germanium interface by insertion of an ultrathin aluminum oxide", Applied Physics Letters 93, 202105, 2008.*
(Continued)

*Primary Examiner* — Tod T Van Roy
*Assistant Examiner* — Vu A Vu
(74) *Attorney, Agent, or Firm* — Foley & Lardner LLP; Antoinette F. Konski; Feng Wei

(57) ABSTRACT

The present invention discloses a preparation method of a germanium-based Schottky junction, comprising, cleaning a surface of N-type germanium-based substrate, then depositing a layer of $CeO_2$ on the surface, and further depositing a layer of metal. The stability Ce—O—Ge bonds can be formed at the interface after rare earth oxides $CeO_2$ are in contact with the germanium substrate, and this is beneficial to reduce the interface state density, improve the quality of the interface, and reduce the MIGS and suppress Fermi-level pinning. Meanwhile, the tunneling resistance introduced by $CeO_2$ between the metal and the germanium substrate is smaller relative to the case of $Si_3N_4$, $Al_2O_3$, $Ge_3N_4$ or the like. In view of the excellent surface characteristics and small conduction band offset relative to the germanium substrate, interposing of the $CeO_2$ dielectric layer is applicable to the preparation the germanium-based Schottky junction having a low resistivity.

8 Claims, 2 Drawing Sheets

(51) Int. Cl.
*H01L 29/812* (2006.01)
*H01L 29/66* (2006.01)
*H01L 29/80* (2006.01)
*H01L 29/872* (2006.01)
*H01L 21/02* (2006.01)
*H01L 21/3213* (2006.01)

(52) U.S. Cl.
CPC ... *H01L21/02266* (2013.01); *H01L 21/02271* (2013.01); *H01L 21/28568* (2013.01); *H01L 21/3213* (2013.01); *H01L 29/66143* (2013.01); *H01L 29/66848* (2013.01); *H01L 29/806* (2013.01); *H01L 29/812* (2013.01); *H01L 29/872* (2013.01)

(56) References Cited

U.S. PATENT DOCUMENTS

2009/0302381 A1* 12/2009 Pan .................. H01L 21/046 257/332
2010/0184264 A1* 7/2010 Rhee ................. H01L 29/66348 438/270
2012/0244694 A1* 9/2012 Shinohara ............ H01L 27/105 438/591

FOREIGN PATENT DOCUMENTS

| CN | 102136428 A | 7/2011 |
| CN | 102206799 A | 10/2011 |
| CN | 103151254 A | 6/2013 |

OTHER PUBLICATIONS

International Search Report and Written Opinion (ISA/CN) for International Application No. PCT/CN2013/084721, mailed Jan. 9, 2014, 13 pages.

* cited by examiner

PREPARATION METHOD OF A GERMANIUM-BASED SCHOTTKY JUNCTION

CROSS-REFERENCE TO RELATED APPLICATIONS

The present application is a national stage application under 35 U.S.C. §371 of International Application No. PCT/CN2013/084721, filed Sep. 30, 2013, which in turn claims priority of Chinese Patent Application No. 201310084986.0, filed Mar. 18, 2013, the content of each of which is incorporated herein by reference in its entirety.

TECHNICAL FIELD

The present invention belongs to a semiconductor device field, and more specially, relates to a preparation method of a germanium-based Schottky junction.

BACKGROUND OF THE INVENTION

As a silicon-based CMOS device in dimension shrinks to a nanometer scale, the conventional method that improves performance of the device by reducing the dimension is facing the dual challenges of physical and technical limitations. To further improve an operating speed of the device, it is required to use high-mobility channel materials. Under low electrical field, germanium material has a hole mobility four times as great as that of silicon material and an electron mobility two times as great as that of silicon material. Thus, germanium material as a new channel material has become one of the promising developing targets for high performance MOSFET devices by virtue of the higher and more symmetric carrier mobility. However, now the preparation technology of germanium-based MOS device is not mature, and NMOSFET device performance is not desirable. High source-drain series resistance is one of the key factors affecting improvement in germanium-based NMOSFET performance.

As compared with silicon material, in germanium material the N-type impurities (such as phosphorus) have lower activation ratio and diffuse more rapidly, it is adverse to the preparation of shallow junctions. Schottky junctions can effectively overcome the above problems, and hence has become a very promising structure. The Schottky junction are different from the conventional PN junction by adoption of a metal or metal germanide instead of a conventional highly-doped region, and this structure not only avoids the problems of low solid solubility and rapid diffusion of impurities, but also achieves an abrupt junction and a low resistivity. For the Schottky junction, the key factor affecting performance is the carrier barrier height between the substrate and the metal. Furthermore, when the metal is in contact with the germanium substrate, the Fermi level is pinned in the vicinity of the top of the valence band, thus the electron barrier height is great, and it is adverse to improve the Schottky junction performance. The Fermi level pinning effect on germanium surface is caused by the following two factors: one is an interface state formed due to the factors such as dangling bonds and defects on the surface of the Germanium material; and the other is a metal-induced-gap-state (MIGS) generated in the forbidden band of the Germanium semiconductor due to incompletely attenuation of electron wave function of metal in Germanium, according to the Heine theory. To eliminate Fermi level pinning between the germanium substrate and the metal, a dielectric layer is interposed between them, and then on the one hand, the dangling bond on the germanium can be passivated to improve the quality of the interface between the germanium substrate and the metal; on the other hand, the interposed dielectric layer may block the electron wave entering the germanium substrate, thereby reducing the MIGS interface state. At present, the materials used as the dielectric layer includes $Si_3N_4$, $Al_2O_3$, $Ge_3N_4$ etc., but the conduction band offsets of these materials relative to germanium are great, so a larger tunneling resistance may be introduced between the germanium substrate and the metal, and this is adverse to increasing the on-state current of the Schottky junction.

As to the passivation of the germanium substrate surface, the rare earth oxides, such as $Y_2O_3$, $La_2O_3$, $CeO_2$, etc., are considered to be excellent passivation material for the germanium substrate surface. This is because the stable X—O—Ge bond (X refers to a rare earth metal element such as Y, La, Ce or the like) may be generated at the interface between the germanium substrate and the metal, when the rare earth oxides are in contact with the germanium substrate, the dangling bonds at the germanium surface is effectively passivated, and the quality of the interface is improved.

SUMMARY OF THE INVENTION

An object of the present invention is to provide a preparation method of a germanium-based Schottky junction, so as to reduce the resistivity of a germanium-based Schottky junction.

The technical solutions provided by the present invention are as follows.

A preparation method of a germanium-based Schottky junction: cleaning a surface of a N-type germanium-based substrate, then depositing a layer of $CeO_2$ on a surface of the N-type germanium-based substrate, and further depositing a layer of metal.

In the preparation method of a germanium-based Schottky junction described above, the surface of N-type germanium-based substrate is cleaned before depositing the layer of $CeO_2$, so as to remove the surface contamination and the natural oxide layer.

In the preparation method of a germanium-based Schottky junction described above, $CeO_2$ may be deposited by ALD process, PLD process, MBE process, CVD process or the like, but it is not limited to the processes described above for depositing $CeO_2$.

In the preparation method of a germanium-based Schottky junction described above, the layer of $CeO_2$ is deposited to have a thickness of 0.3~2 nm.

In the preparation method of a germanium-based Schottky junction described above, the deposited metal may be Al, Pt, Au, Ti, Ni, TiN, TaN, W or the like, but it is not limited to these deposited metal described above.

In the preparation method of a germanium-based Schottky junction described above, photolithography process, etching process, annealing process and the like. may be performed after depositing the metal.

The preparation method of a germanium-based Schottky junction according to the present is applicable to a bulk germanium substrate, a GOI (Germanium-on-insulator) substrate, or any substrate containing germanium epitaxial layer on a surface thereof, and is also applicable to a germanium-containing compound semiconductor substrate, such as SiGe, GeSn or the like.

The present invention has the following advantages:

The stability Ce—O—Ge bonds are formed at the interface after rare earth oxides $CeO_2$ are in contact with the germanium substrate, and this is beneficial to reduce the interface state density, improve the quality of the interface, and reduce the MIGS and suppress Fermi-level pinning. Meanwhile, the tunneling resistance introduced by $CeO_2$ between the metal and the germanium substrate is smaller relative to $Si_3N_4$, $Al_2O_3$, $Ge_3N_4$ etc. ($Si_3N_4$ has a forbidden band width of 5.3 eV and a conduction band offset of ~2.03 eV relative to the germanium substrate; $Al_2O_3$ has a forbidden band width of 6.1 eV and a conduction band offset of ~1.74 eV relative to the germanium substrate; $Ge_3N_4$ has a forbidden band width of 4.4 eV and a conduction band offset of ~1.5 eV relative to the germanium substrate. In turn, $CeO_2$ has a forbidden band width of ~3.3eV, and a conduction band offset of ~0.4 eV relative to the germanium substrate, as shown in FIG. 1). In view of the excellent interface characteristics and small conduction band offset relative to the germanium substrate, interposing of the $CeO_2$ dielectric layer is applicable to the preparation of the germanium-based Schottky junction having a low resistivity.

Wherein, 1—bulk germanium substrate; 2—$CeO_2$; 3—metal Al; 4—back electrode Al.

DETAILED DESCRIPTION OF THE EMBODIMENTS

Figure 1:
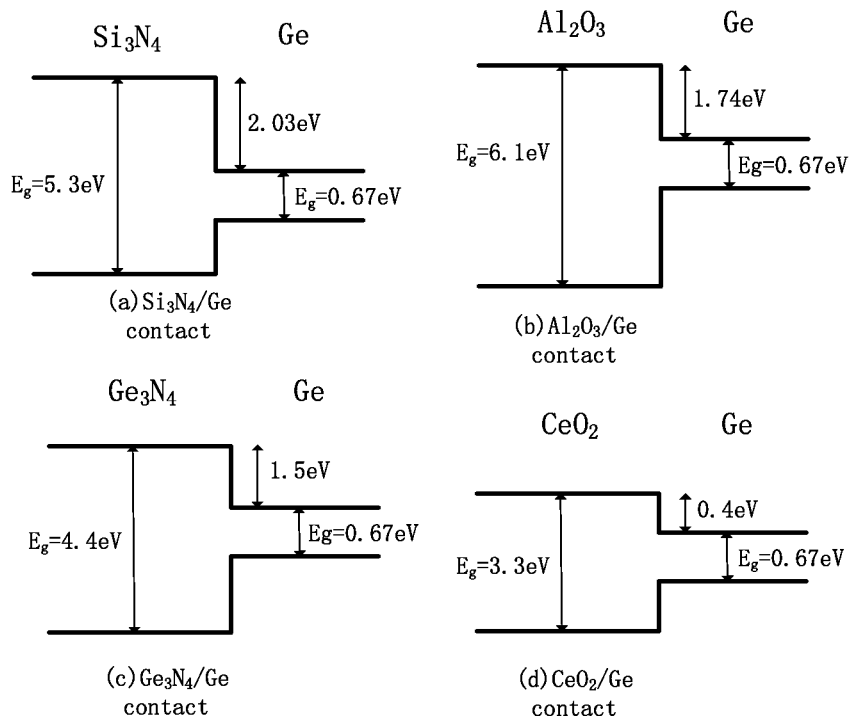
FIG. 1 shows an energy band diagram of the materials such as $Si_3N_4$, $Al_2O_3$, $Ge_3N_4$, $CeO_2$ in contact with the germanium substrate.
Figure 2:
FIG. 2 to FIG. 6 are cross-sectional views illustrating an embodiment of a method for preparing a germanium-based Schottky junction.
Figure 3:
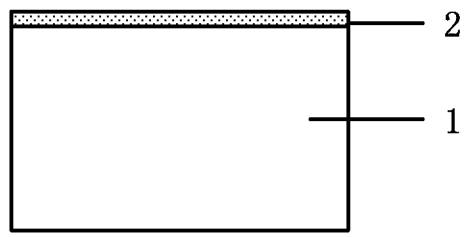
Figure 4:
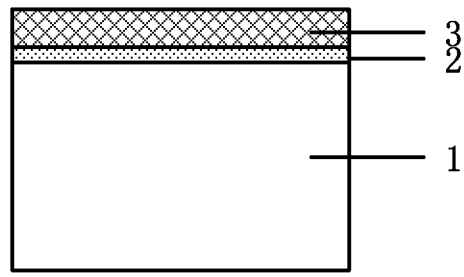
Figure 5:
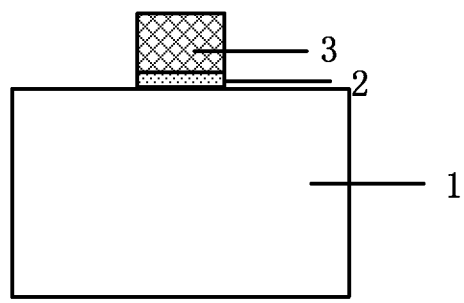
Figure 6:
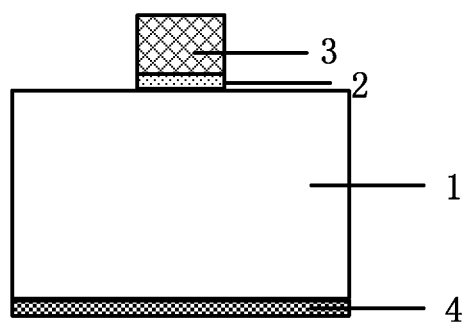

Hereinafter, the method in accordance with the present invention will be described below in more detail in conjunction with the exemplary embodiments with reference to the accompanying drawings, the implementation steps are described as follows:

1) selecting N-type semiconductor germanium substrate, which may be a bulk germanium substrate, a Germanium on Insulator (GeOI) substrate, or a Germanium-on-silicon substrate or the like, in the present embodiment, preferably, the bulk germanium substrate is used, as shown in FIG. 2;
2) cleaning the germanium substrate, wherein, firstly, organically cleaning the germanium substrates by immersion cleaning with acetone and ethanol in sequence and then rinsing with DI water to remove oil and organic contaminants on the germanium substrate; and secondly cleaning with hydrochloric acid by heating dilute hydrochloric acid to boil in which the germanium substrate is immersed and then rinsing with DI water to remove inorganic contaminants, metal particles, etc.;
3) removing the oxide on the germanium substrate surface, wherein the removing can be performed by using HF or HCl solution immersion process, or the high-temperature vacuum annealing process. In the present embodiment, it is preferable that HCl solution immersion process is used. The detailed steps are described as follows: firstly immersing with dilute HF (HF:$H_2O$=1: 5~1:60) solution for 10~50 seconds; secondly rinsing with DI water for 10~50 seconds; and repeating 5~10 cycles of the above steps;
4) depositing a layer of $CeO_2$ to a thickness of 0.3~2 nm on the substrate , wherein $CeO_2$ can be deposited by the process such as ALD, PLD, MBE, CVD or the like, and the thickness is preferably 0.6 nm in the present embodiment, as shown in FIG. 3;
5) depositing a metal, wherein the deposited metal may be Al, Pt, Au, Ti, Ni, TiN, TaN, W or the like, and a sputtering process is used to deposit a layer of 200 nm Al in the present embodiment, as shown in FIG. 4;
6) performing photolithography process and etching process on the layer of metal to form a desired pattern, as shown in FIG. 5;
7) depositing a back electrode, in the preferred embodiment, preferably depositing Al to 200 nm, as shown in FIG. 6;
8) annealing after depositing the back electrode, wherein annealing for 15 min in $N_2$ atmosphere under 350° C.

The preparation method of a germanium-based Schottky junction proposed by the present invention has been described in more detail above through the preferred embodiment. Those skilled in the art would understand that, the above-mentioned is only a preferred embodiment of the present invention, and various changes and modifications may be made to the device structure of the present invention without departing from the spirit and scope of the present invention; and the preparation method of the present invention is not limited to the content disclosed in the embodiment, all equivalent changes and modifications made in accordance with the accompanying claims all fall within the scope of the present invention as defined in the accompanying claims.

What is claimed is:

1. A preparation method of a germanium-based Schottky junction, comprising, cleaning a surface of a N-type germanium-based substrate, then depositing a layer of passivation material $CeO_2$ on the surface, and further depositing a layer of metal,
   wherein the N-type germanium-based substrate, the layer of passivation material $CeO_2$, and the layer of metal form a Schottky junction.
2. The preparation method according to claim 1, wherein, the depositing of the layer of passivation material $CeO_2$ is performed by ALD, PLD, MBE, or CVD process.
3. The preparation method according to claim 1, wherein, the layer of passivation material $CeO_2$ is deposited to have a thickness of 0.3~2 nm.
4. The preparation method according to claim 1, wherein, the deposited metal is Al, Pt, Au, Ti, Ni, TiN, TaN, or W.
5. The preparation method according to claim 1, wherein, performing Photolithography process, etching process, and annealing process after depositing the metal.
6. The preparation method according to claim 1, wherein, the N-type germanium substrate is a bulk germanium substrate, a Germanium-on-Insulator substrate, or any substrate containing germanium epitaxial layer on a surface thereof.
7. The preparation method according to claim 1, wherein, the N-type germanium substrate is a germanium-containing compound semiconductor substrate.
8. The preparation method according to claim 7, wherein, the germanium-containing compound is SiGe or GeSn.

* * * * *